United States Patent
Chen

(10) Patent No.: US 10,553,375 B2
(45) Date of Patent: Feb. 4, 2020

(54) KEYBOARD DEVICE

(71) Applicant: Primax Electronics Ltd., Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/357,073

(22) Filed: Mar. 18, 2019

(65) Prior Publication Data

US 2019/0214202 A1    Jul. 11, 2019

Related U.S. Application Data

(62) Division of application No. 15/790,231, filed on Oct. 23, 2017, now Pat. No. 10,490,368.

(30) Foreign Application Priority Data

May 12, 2017 (TW) .............................. 106115800 A

(51) Int. Cl.
    H01H 13/83      (2006.01)
    H01H 13/702     (2006.01)
    H03K 17/98      (2006.01)
    H01H 13/705     (2006.01)
    H03K 17/969     (2006.01)

(52) U.S. Cl.
    CPC .......... *H01H 13/83* (2013.01); *H01H 13/702* (2013.01); *H01H 13/705* (2013.01); *H03K 17/969* (2013.01); *H03K 17/98* (2013.01); *H01H 2219/0023* (2013.01); *H01H 2219/056* (2013.01); *H01H 2219/062* (2013.01); *H01H 2219/0621* (2013.01); *H01H 2221/026* (2013.01); *H01H 2221/04* (2013.01); *H01H 2221/058* (2013.01); *H01H 2233/002* (2013.01); *H01H 2233/07* (2013.01)

(58) Field of Classification Search
    CPC ................. H01H 13/83; H01H 13/702; H01H 2219/0621; H01H 2233/07
    USPC ........................................................ 200/5 A
    See application file for complete search history.

(56) References Cited

U.S. PATENT DOCUMENTS

| 2008/0164132 | A1* | 7/2008 | Yoo ........................ | H01H 13/83 200/5 A |
| 2014/0166455 | A1* | 6/2014 | Chen ...................... | H03K 17/98 200/5 A |
| 2014/0311881 | A1* | 10/2014 | Krumpelman ......... | H01H 13/14 200/5 A |

* cited by examiner

*Primary Examiner* — Edwin A. Leon
*Assistant Examiner* — Iman Malakooti
(74) *Attorney, Agent, or Firm* — Kirton McConkie; Evan R. Witt

(57) ABSTRACT

A keyboard device includes plural key structures, an electronic paper display element and an illumination module. The electronic paper display element is disposed under the plural key structures. The plural key symbols corresponding to the plural key structures are displayed on the electronic paper display element. The illumination module is disposed over the electronic paper display element to provide a light beam to the electronic paper display element. Consequently, the plural key symbols are illuminated.

9 Claims, 9 Drawing Sheets

KEYBOARD DEVICE

CROSS-REFERENCE TO RELATED APPLICATION

This is a divisional application of application Ser. No. 15/790,231, filed Oct. 23, 2017, which application is incorporated by reference.

FIELD OF THE INVENTION

The present invention relates to an input device, and more particularly to a keyboard device.

BACKGROUND OF THE INVENTION

Generally, the widely-used peripheral input device of a computer system includes for example a mouse device, a keyboard device, a trackball device, or the like. Via the keyboard device, characters or symbols can be inputted into the computer system directly. As a consequence, most users and most manufacturers of the input devices pay much attention to the keyboard devices.

Please refer to FIGS. 1, 2 and 3. FIG. 1 is a schematic top view illustrating the outward appearance of a conventional keyboard device. FIG. 2 is a schematic perspective view illustrating a portion of the conventional keyboard device of FIG. 1. FIG. 3 is a schematic exploded view illustrating a portion of the conventional keyboard device of FIG. 1. For succinctness, only a portion of the key frame, a single key structure and associated components are shown in FIGS. 2 and 3.

The conventional keyboard device 1 comprises plural key structures 10, a base plate 11, a membrane circuit board 12 and a key frame 13. The membrane circuit board 12 comprises plural membrane switches 121 corresponding to the plural key structures 10. Each of the plural key structures 10 comprises a keycap 101, a scissors-type connecting element 102 and an elastic element 103. The scissors-type connecting element 102 is connected between the keycap 101 and the base plate 11. Moreover, the scissors-type connecting element 102 comprises a first frame 1021 and a second frame 1022. The second frame 1022 is pivotally coupled to the first frame 1021. Consequently, the first frame 1021 and the second frame 1022 can be swung relative to each other. The elastic element 103 is arranged between the keycap 101 and the base plate 11. Moreover, the elastic element 103 comprises a contacting part (not shown).

While the keycap 101 of any key structure 10 is depressed and moved downwardly relative to the base plate 11, the first frame 1021 and the second frame 1022 of the scissors-type connecting element 102 are switched from an open-scissors state to a stacked state. Moreover, as the keycap 101 is moved downwardly to compress the elastic element 103, the corresponding membrane switch 121 is pushed and triggered by the contacting part of the elastic element 103. Consequently, the keyboard device 1 generates a corresponding key signal. When the keycap 101 of the key structure 10 is no longer depressed, the keycap 101 is moved upwardly relative to the base plate 11 in response to an elastic force of the elastic element 103. Meanwhile, the first frame 1021 and the second frame 1022 are switched from the stacked state to the open-scissors state again, and the keycap 101 is returned to its original position.

Moreover, the key structures 10 of the keyboard device 1 are classified into some types, e.g., ordinary keys, numeric keys and function keys. When one of the key structures 10 is depressed by the user's finger, a corresponding key signal is generated to the computer, and thus the computer executes a function corresponding to the depressed key. For example, when an ordinary key is depressed, a corresponding letter is inputted into the computer. When a numeric key is depressed, a corresponding number is inputted into the computer. In addition, the function keys (F1~F12) can be programmed to provide various quick access functions. For allowing the user to recognize the functions of all key structures 10, the keycaps of these key structures 10 are printed with the corresponding key symbols. For example, the key symbols include ordinary symbols 1011, numeric symbols 1012 and/or access function symbols 1013.

Generally, the arrangements of the key symbols for different languages are distinguished. In views of cost-effectiveness, the manufacturer prefers to sells the same kind of keyboard device 1 to different countries. However, if the arrangements of the key symbols to be printed on the keycaps 101 of the keyboard device 1 are changed according to the languages of different countries, the printing process is very complicated. Moreover, after the key symbols have been printed on the keycaps 101 of the keyboard device 1, the arrangement of the key symbols on the keycaps 101 cannot be changed. Since the arrangement of the key symbols on the keycaps 101 cannot be changed, the conventional keyboard device 1 is not user-friendly to the user that intends to change the arrangement of the key symbols. In other words, the conventional keyboard device 1 needs to be further improved.

SUMMARY OF THE INVENTION

The present invention relates to a keyboard device, and more particularly to a keyboard device with an electronic paper display element for dynamically displaying key symbols.

In accordance with an aspect of the present invention, there is provided a keyboard device. The keyboard device includes plural key structures, an electronic paper display element, a membrane circuit board and an illumination module. The plural key structures include plural keycaps, respectively. Moreover, plural key symbols are displayed on the electronic paper display element. The membrane circuit board is arranged between the plural keycaps and the electronic paper display element, and includes plural membrane switches corresponding to the plural key structures. When one of the plural keycaps is moved downwardly toward the membrane circuit board to trigger the corresponding membrane switch, the membrane circuit board generates a corresponding key signal. The illumination module emits a light beam to the electronic paper display element so as to illuminate the plural key symbols.

In accordance with another aspect of the present invention, there is provided a keyboard device. The keyboard device includes plural key structures, an electronic paper display element, plural optical switch modules corresponding to the plural key structures, a processing unit and an illumination module. The plural key structures include plural keycaps, respectively. Moreover, plural key symbols are displayed on the electronic paper display element. Each of the plural optical switch modules includes an optical emitter and an optical sensor. The optical emitter emits a first light beam. The optical sensor senses the first light beam. The processing unit is electrically connected with the optical sensor and generates a corresponding key signal according to a sensing result of the optical sensor. The sensing result is determined according to a location of the corresponding keycap. The illumination module emits a second light beam to the electronic paper display element so as to illuminate the plural key symbols.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
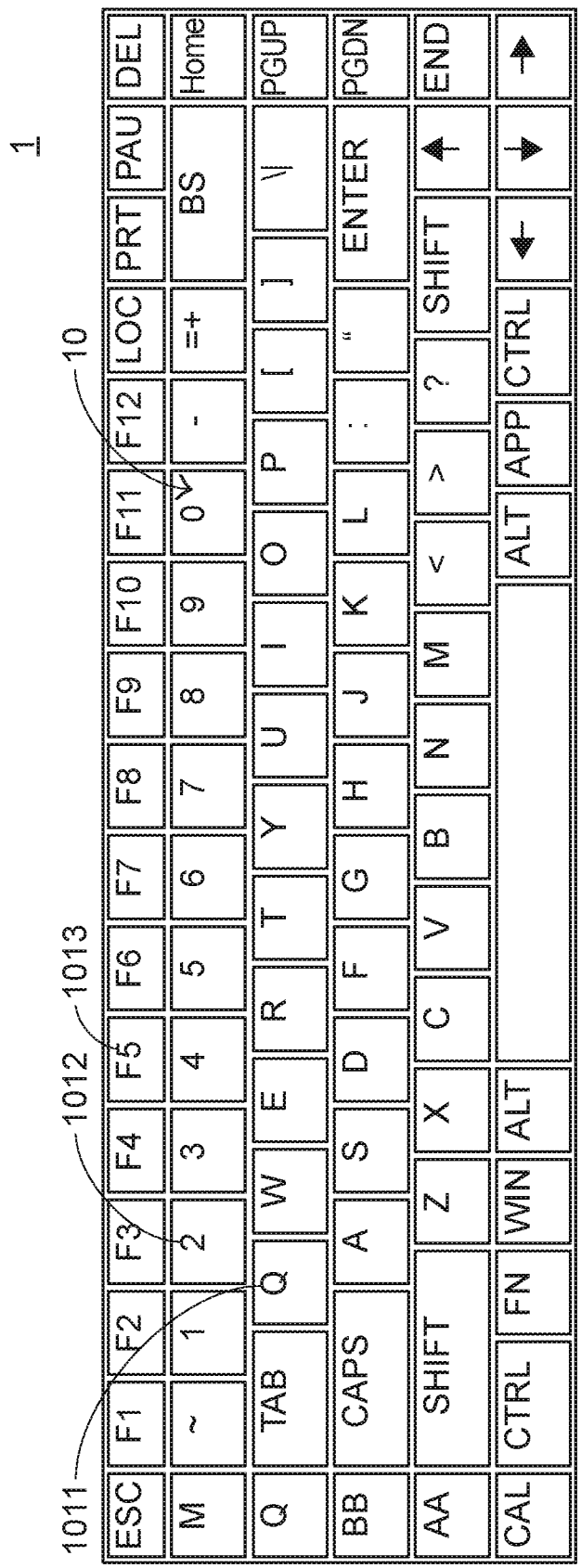
FIG. 1 is a schematic top view illustrating the outward appearance of a conventional keyboard device.
Figure 2:
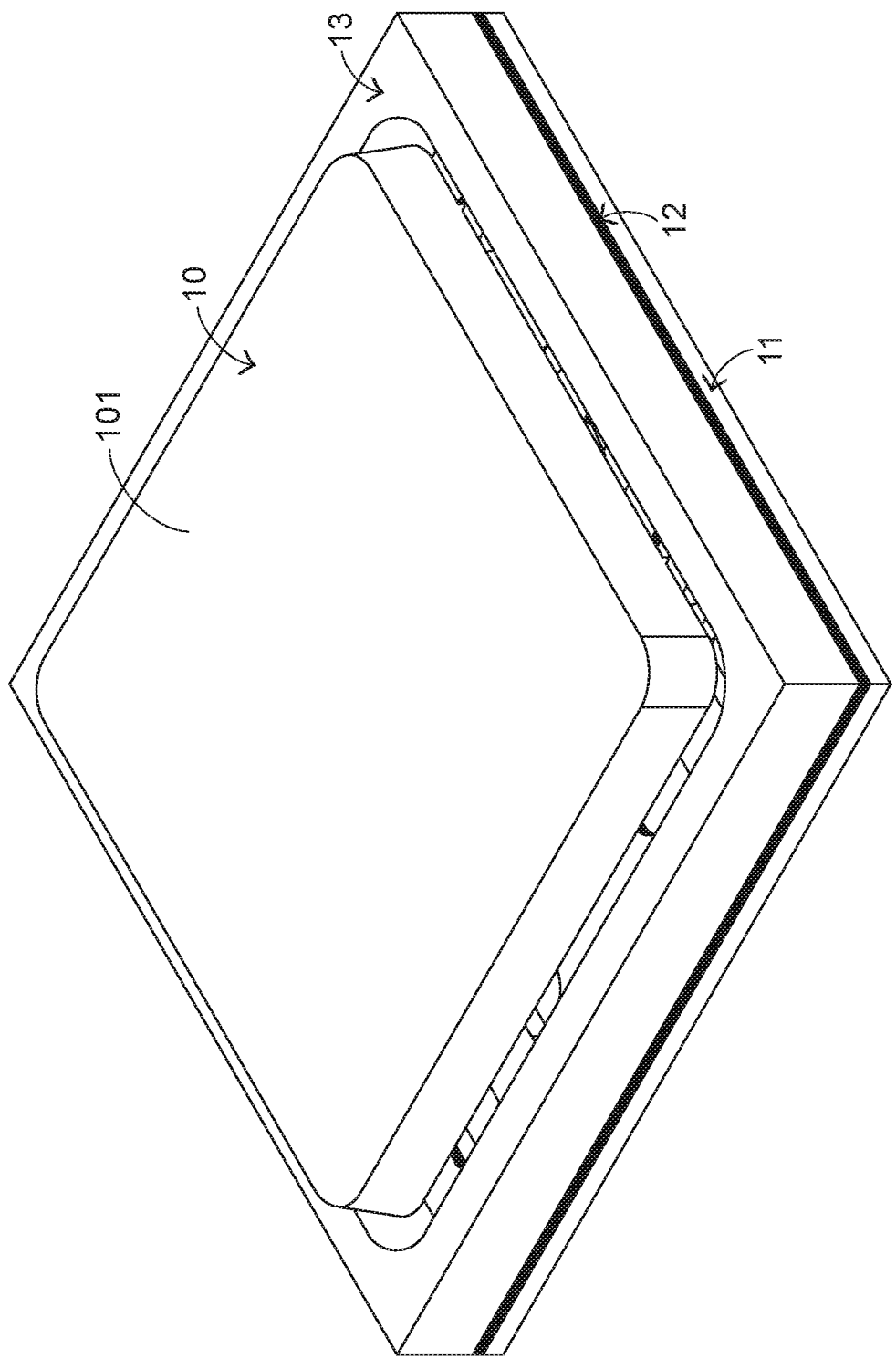
FIG. 2 is a schematic perspective view illustrating a portion of the conventional keyboard device of FIG. 1.
Figure 3:
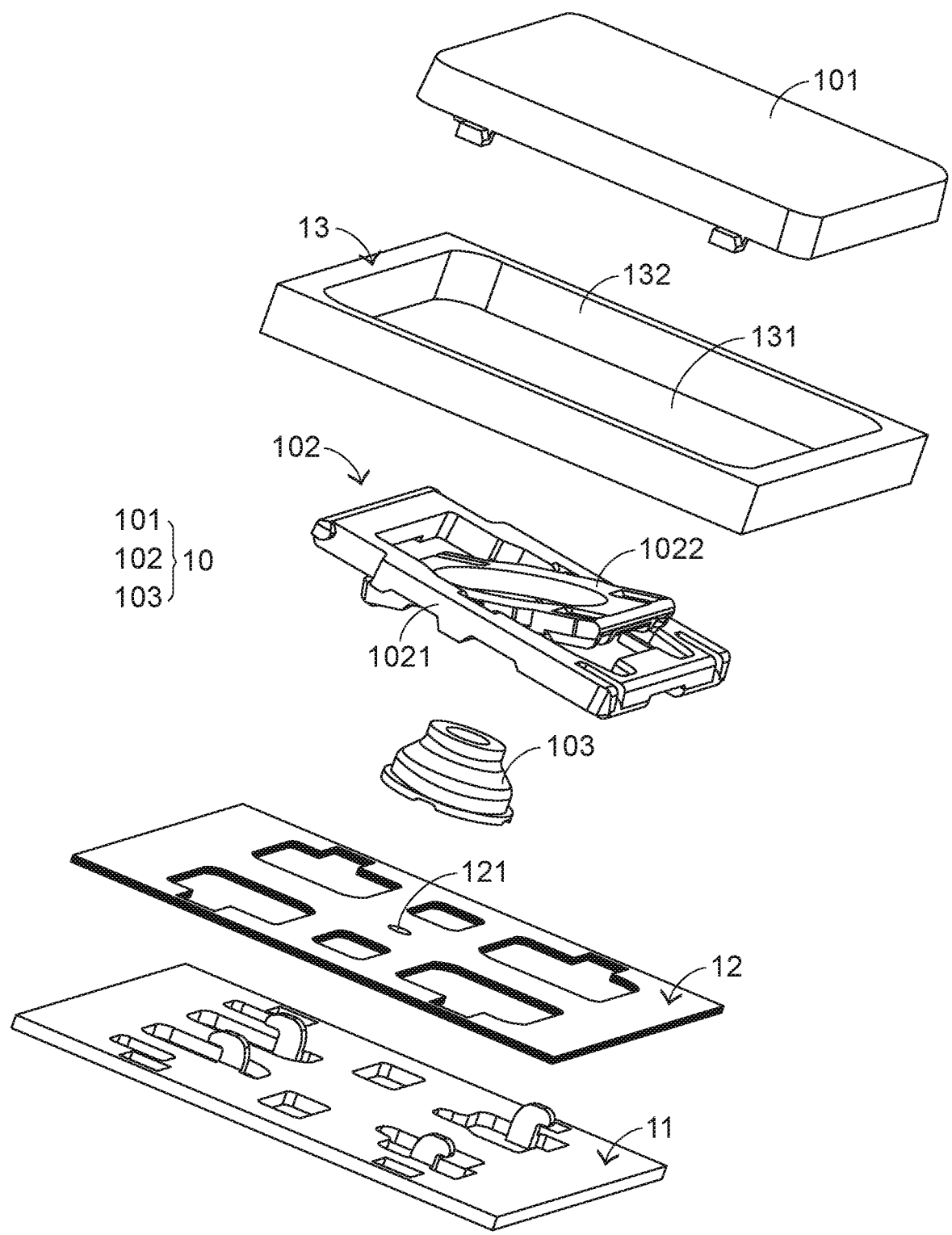
FIG. 3 is a schematic exploded view illustrating a portion of the conventional keyboard device of FIG. 1.
Figure 4:
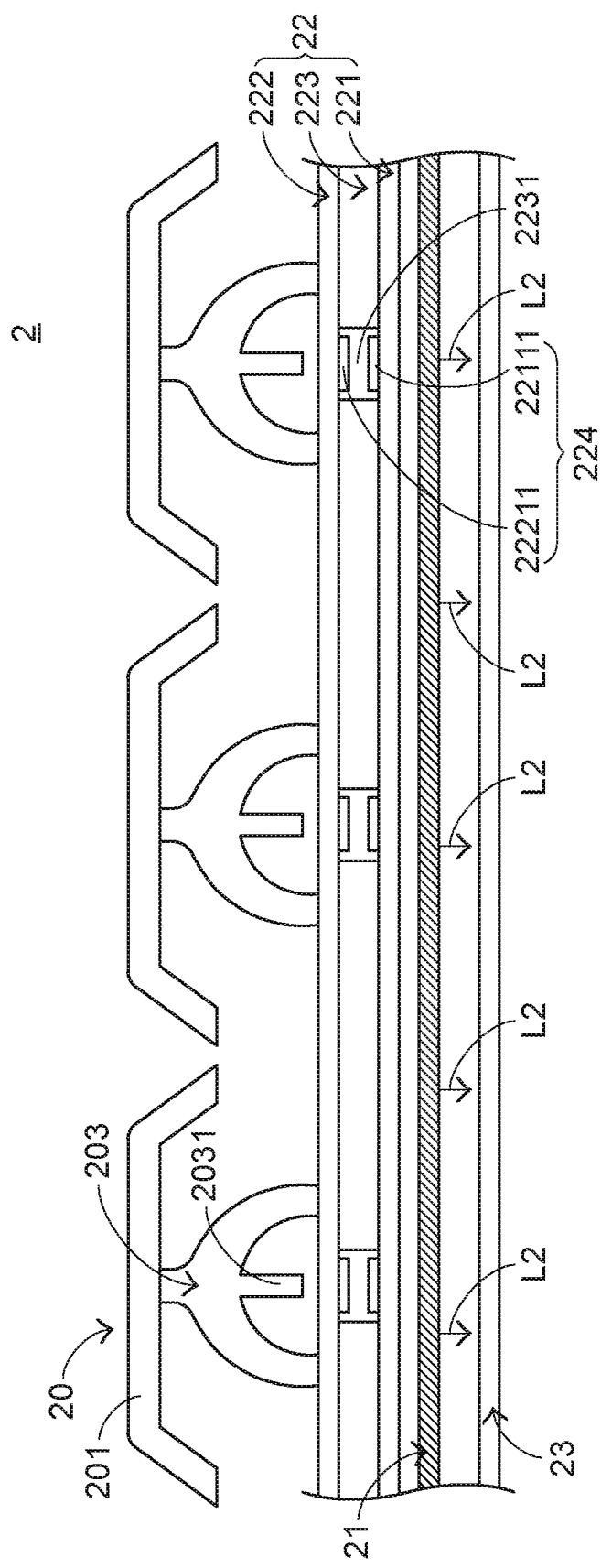
FIG. 4 is a schematic cross-sectional side view illustrating a keyboard device according to a first embodiment of the present invention.

FIG. 4 is a schematic cross-sectional side view illustrating a keyboard device according to a first embodiment of the present invention. From top to bottom, plural key structures 20, a membrane circuit board 22, an illumination module 21 and an electronic paper display element 23. Each key structure 20 comprises a keycap 201 and an elastic element 203 between the keycap 201 and the membrane circuit board 22. The elastic element 203 is arranged between the keycap 201 and the membrane circuit board 22. Moreover, the elastic element 203 comprises a contacting part 2031. Preferably but not exclusively, the elastic element 203 is a rubbery dome. In an embodiment, a rubbery layer is defined by plural rubbery domes collaboratively.

Figure 5:
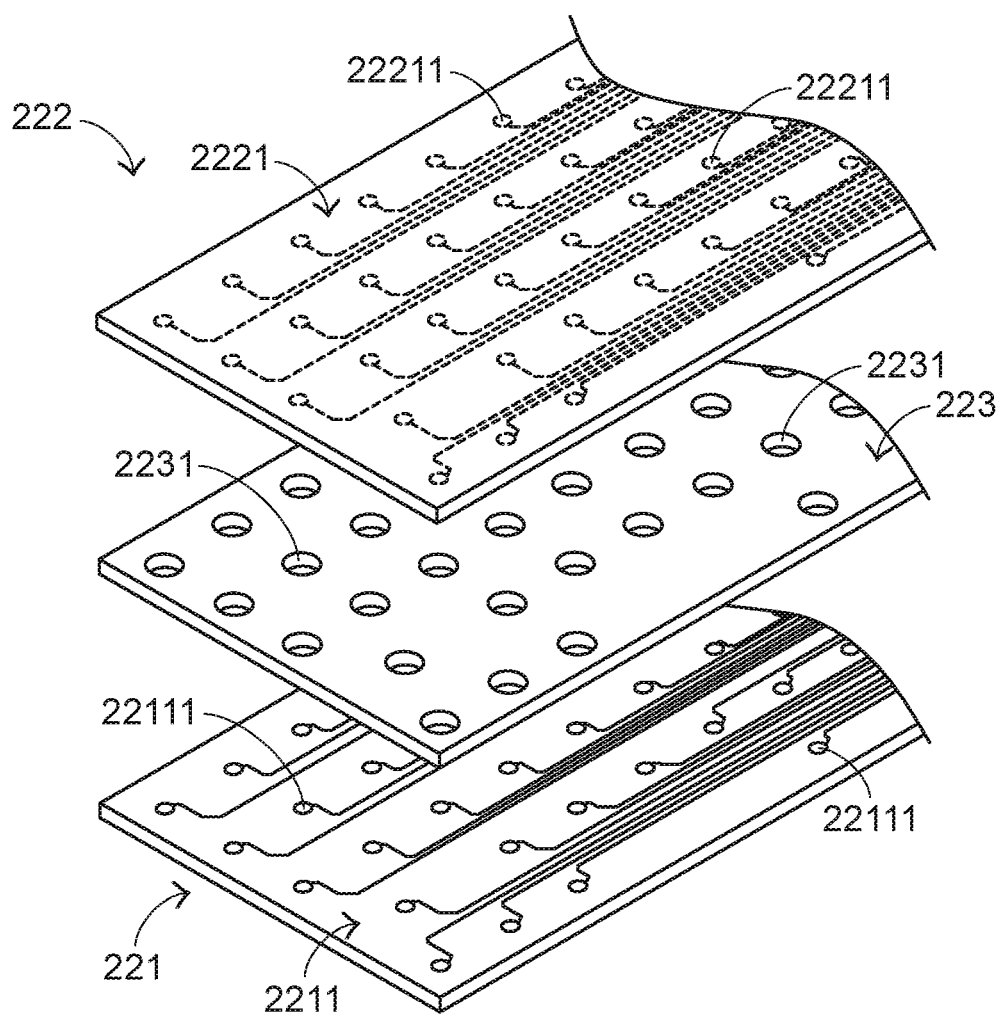
FIG. 5 is a schematic exploded view illustrating the membrane circuit board of the keyboard device of FIG. 4.

FIG. 5 is a schematic exploded view illustrating the membrane circuit board of the keyboard device of FIG. 4. The membrane circuit board 22 is arranged between the plural keycaps 201 and the electronic paper display element 23. Moreover, the membrane circuit board 22 comprises plural membrane switches 224. In this embodiment, the membrane switches 224 are resistive membrane switches. As shown in FIG. 5, the membrane circuit board 22 comprises an upper film layer 222, a lower film layer 221 and an intermediate film layer 223. The intermediate film layer 223 is arranged between the upper film layer 222 and the lower film layer 221. A first circuit pattern 2221 is formed on a bottom surface of the upper film layer 222. The first circuit pattern 2221 comprises plural upper contacts 22211 corresponding to the plural key structures 20. A second circuit pattern 2211 is formed on a top surface of the lower film layer 221. The second circuit pattern 2211 comprises plural lower contacts 22111 corresponding to the plural upper contacts 22211. In addition, the intermediate film layer 223 comprises plural perforations 2231 corresponding to the plural upper contacts 22211 and the plural lower contacts 22111. Each of the upper contacts 22211 and the corresponding lower contact 22111 are separated from each other by a spacing distance. Moreover, each of the upper contacts 22211 and the corresponding lower contact 22111 are collectively defined as a membrane switch 224.

Moreover, the key structures 20 of the keyboard device 2 are classified into some types, e.g., ordinary keys, numeric keys and function keys. When one of the key structures 20 is depressed by the user's finger, a corresponding key signal is generated to the computer, and thus the computer executes a function corresponding to the depressed key. For example, when an ordinary key is depressed, a corresponding letter is inputted into the computer. When a numeric key is depressed, a corresponding number is inputted into the computer. In addition, the function keys (F1~F12) can be programmed to provide various quick access functions. For allowing the user to recognize the functions of all key structures 20, key symbols are displayed on the electronic paper display element 23 of the keyboard device 2.

Figure 6:
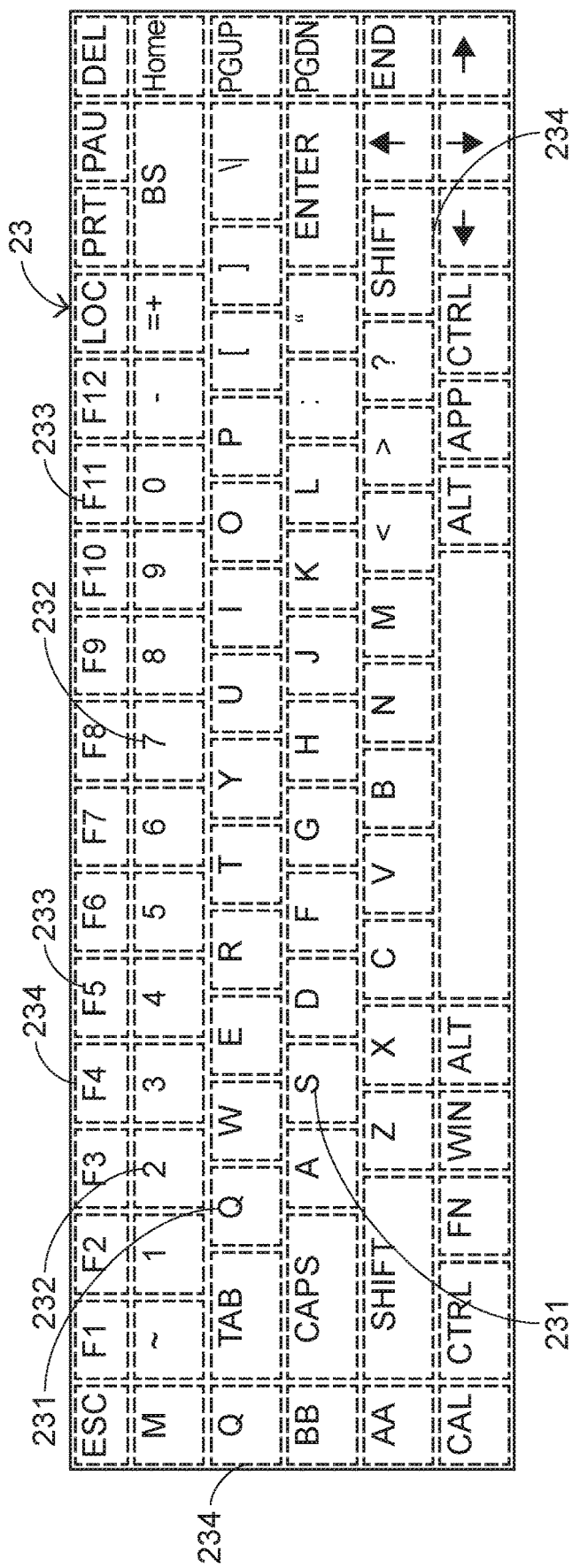
FIG. 6 is a schematic top view illustrating the electronic paper display element of the keyboard device of FIG. 4.

FIG. 6 is a schematic top view illustrating the electronic paper display element of the keyboard device of FIG. 4. The electronic paper display element 23 comprises plural display blocks 234. The plural display blocks 234 are disposed under the corresponding keycaps 201. According to the practical requirements, specified key symbols are displayed on display blocks 234 of the electronic paper display element 23. For example, the key symbols include ordinary symbols 231, numeric symbols 232 and/or access function symbols 233. The illumination module 21 is arranged between the electronic paper display element 23 and the membrane circuit board 22. The illumination module 21 emits a light beam (e.g., a second light beam L2) to the electronic paper display element 23 in order to illuminate the plural key symbols that displayed on the electronic paper display element 23.

In an embodiment, the illumination module 21 is a front light source that is disposed over the electronic paper display element 23, and the keycaps 201, the elastic elements 203 and the membrane circuit board 22 are all made of light-transmissible material. After the second light beam L2 from the illumination module 21 is projected on the key symbols of the electronic paper display element 23, the second light beam L2 is reflected by the key symbols. The reflected second light beam L2 is transmitted through the membrane circuit board 22, the elastic elements 203 and the keycaps 201 sequentially and projected onto the user's eyes. Consequently, the key symbols corresponding to the key structures 20 are viewed by the user. In other words, the functions corresponding to the key structures can be easily recognized by the user. In accordance with the present invention, the second light beam L2 from the illumination module 21 is a monochromatic light beam or a polychromatic light beam. In other words, the key symbols displayed on the electronic paper display element 23 are not restrained to produce the monochromatic effect.

Moreover, according to an electronic paper displays (EPD) technology, the electronic paper display element 23 has the visual effect similar to the effect of printing and writing on papers. Since the displayed image under strong ambient light (e.g., under the sun light) is still sharp, the electronic paper display element 23 is favored by most readers. The displaying technologies of the electronic paper display element 23 are well known to those skilled in the art, and are not redundantly described herein. Moreover, since the power consumption of the electronic paper display element 23 is very low, the use of the electronic paper display element 23 in the keyboard device 2 achieves a power-saving purpose.

The operations of the keyboard device 2 will be described as follows. When the user intends to operate the keyboard device 2 to have the computer execute a specified function, the user has to search the key symbol of the electronic paper display element 23 corresponding to the specified function. Then, the keycap 201 of the corresponding key structure 20 is depressed. While the keycap 201 of the corresponding key structure 20 is depressed and moved downwardly relative to the membrane circuit board 22, the keycap 201 is moved downwardly to compress the elastic element 203. Consequently, the elastic element 203 provides an elastic force. Moreover, the corresponding upper contact 22211 is pushed and triggered by the contacting part 2031 of the elastic element 203. Consequently, the corresponding upper contact 22211 is contacted with the corresponding lower contact 22111 through the corresponding perforation 2231. In such way, the corresponding membrane switch 224 is electrically conducted, and the key signal corresponding to the specified function is generated by the membrane circuit board 22 and transmitted to the computer. When the keycap 201 of the key structure 20 is no longer depressed, the keycap 201 is moved upwardly relative to the membrane circuit board 22 in response to the elastic force of the elastic element 203. Consequently, the keycap 201 is returned to its original position.

In the keyboard device 2 of this embodiment, the membrane circuit board 22 is arranged between the plural key structures 20 and the electronic paper display element 23. Under this circumstance, there are no other obstructing components between the membrane switches 224 and the corresponding key structures 20. While any of the keycaps 201 is depressed, the corresponding membrane switch 224 is directly triggered. Consequently, the keyboard device 2 provides better operating sensitivity and enhanced tactile feel.

In the first embodiment, the keycap is returned to its original position in response to the elastic force when the keycap is not depressed. It is noted that the way of returning the keycap is not restricted. In another embodiment, the keycap is returned to its original position in response to a magnetic force when the keycap is not depressed.

Figure 7:
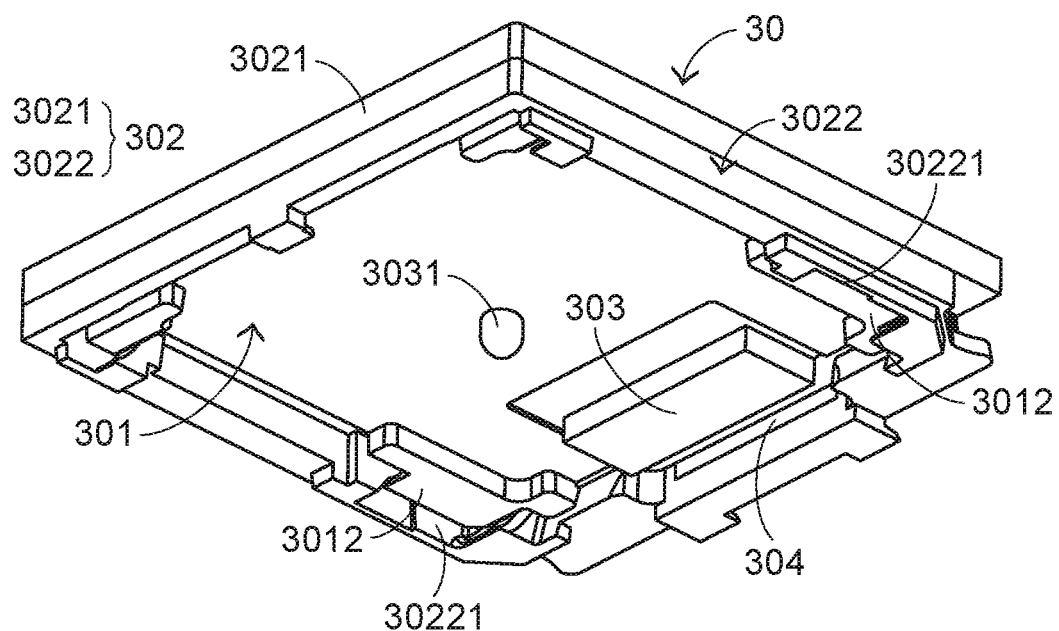
FIG. 7 is a schematic exploded view illustrating a portion of a key structure of a keyboard device according to a second embodiment of the present invention.

FIG. 7 is a schematic perspective view illustrating a portion of a key structure of a keyboard device according to a second embodiment of the present invention. The components of this embodiment similar to those of the first embodiment are not redundantly described herein. In comparison with the first embodiment, the structure and the constituent of the key structure 30 of this embodiment are distinguished. Moreover, the structure and the constituent of the key structure 30 of this embodiment may be applied to the keyboard device of the first embodiment or the following embodiments.

In this embodiment, each key structure 30 comprises a keycap 301, a frame module 302, a first magnetic element 303 and a second magnetic element 304. The keycap 301 comprises a contacting part 3011. The first magnetic element 303 is disposed on the keycap 301. The second magnetic element 304 is disposed on the frame module 302. Moreover, the keycap 301 is movable within the frame module 302. The frame module 302 comprises a key frame 3021 and a connecting element 3022. The connecting element 3022 is disposed under the key frame 3021. The keycap 301 is movable upwardly or downwardly relative to the key frame 3021 through the connecting element 3022.

The first magnetic element 303 is disposed on a bottom surface of the keycap 301, and located at a first side of the keycap 301. The second magnetic element 304 is disposed on a first sidewall of the connecting element 3022, and located near the first magnetic element 303. The first magnetic element 303 and the second magnetic element 304 are magnetically attracted by each other so as to generate a magnetic force. On the other hand, the keycap 301 further comprises plural bulges 3012. The plural bulges 3012 are disposed on the keycap 301 and located at a second side of the keycap 301. The second side of the keycap 301 is different to the first side where the first magnetic element 303 is located. The connecting element 3022 further comprises plural inclined guiding recesses 30221. The plural inclined guiding recesses 30221 are formed in a second sidewall of the connecting element 3022, and aligned with the corresponding bulges 3012 of the keycap 301. The plural inclined guiding recesses 30221 are contacted with the corresponding bulges 3012. Moreover, the plural bulges 3012 are movable within the corresponding inclined guiding recesses 30221.

Since the connecting element 3022 is covered by the key frame 3021, the keycap 301 is only permitted to be moved within the range between the key frame 3021 and the connecting element 3022 without being detached from the key frame 3021. In this embodiment, the connecting element 3022 is a guide array that supports the keycap 301 but is not swung with the movement of the keycap 301. Both of the first magnetic element 303 and the second magnetic element 304 are magnets, but are not limited thereto. In another embodiment, one of the first magnetic element 303 and the second magnetic element 304 is a magnet, and the other of the first magnetic element 303 and the second magnetic element 304 is a metal sheet.

The operations of the key structure 30 will be described as follows. In case that the keycap 301 is not depressed by the user, the first magnetic element 303 on the keycap 301 is magnetically attracted by the second magnetic element 304 on the connecting element 3022. When the keycap 301 is depressed by the user and the depressing force on the keycap 301 is larger than the magnetic force generated by the first magnetic element 303 and the second magnetic element 304, the plural bulges 3012 of the keycap 301 are moved from first ends (i.e. the upper ends as shown in FIG. 7) of the corresponding inclined guiding recesses 30221 to second ends (i.e. the lower ends as shown in FIG. 7) of the corresponding inclined guiding recesses 30221. That is, the keycap 301 is moved downwardly relative to the key frame 3021. Meanwhile, the contacting part 3011 of the keycap 301 is contacted with the corresponding membrane switch 224 of the membrane circuit board 22 (see FIGS. 4 and 5). Consequently, the membrane circuit board 22 is triggered to generate the corresponding key signal. When the keycap 301 is no longer depressed by the user, the magnetic force generated by the first magnetic element 303 and the second magnetic element 304 is no longer influenced by the depressing force. Under this circumstance, the first magnetic element 303 is magnetically attracted by the second magnetic element 304, and thus the first magnetic element 303 is moved upwardly. Consequently, the plural bulges 3012 of the keycap 301 are moved from the second ends of the corresponding inclined guiding recesses 30221 to the first ends of the corresponding inclined guiding recesses 30221, and the keycap 301 is returned to its original position.

In the first embodiment and the second embodiment, the membrane switches of the membrane circuit board are resistive membrane switches. In some other embodiments, the membrane switches are capacitive membrane switches.

Figure 8:
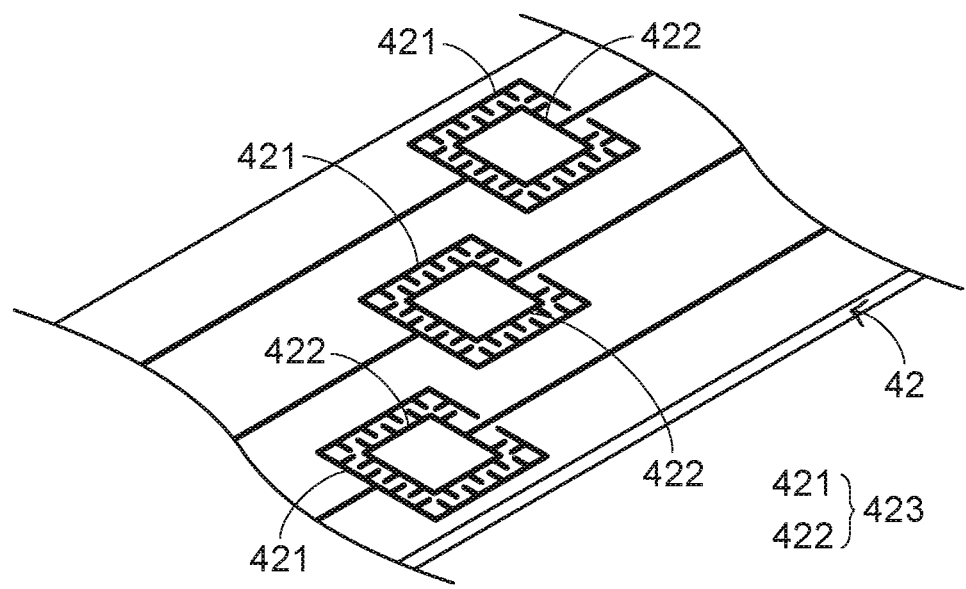
FIG. 8 is a schematic perspective view illustrating a portion of a membrane circuit board of a keyboard device according to a third embodiment of the present invention.

FIG. 8 is a schematic perspective view illustrating a portion of a membrane circuit board of a keyboard device according to a third embodiment of the present invention. The components of this embodiment similar to those of the first embodiment are not redundantly described herein. In comparison with the first embodiment and the second embodiment, the structure and the constituent of the membrane circuit board 42 of this embodiment are distinguished. Moreover, the structure and the constituent of the membrane circuit board 42 of this embodiment may be applied to the keyboard device of the first embodiment, the second embodiment or the following embodiments.

In an embodiment, the membrane circuit board 42 is a single-layered circuit board. The membrane circuit board 42 comprises plural first electrode patterns 421 corresponding to the plural key structures 20 or 30 (see FIGS. 4 and 7) and plural second electrode patterns 422 corresponding to the plural first electrode patterns 421. Each of the plural first electrode patterns 421 and the corresponding second electrode pattern 422 are separated from each other by a spacing distance. Moreover, each of the plural first electrode patterns 421 and the corresponding second electrode pattern 422 are collaboratively defined as a membrane switch 423. When the membrane circuit board 42 is electrically conducted, plural electric fields are generated between the first electrode patterns 421 and the corresponding second electrode patterns 422. If one of the electric fields is changed, the corresponding membrane switch 423 is triggered, so that the membrane circuit board 42 generates the corresponding key signal.

In comparison with the first embodiment and the second embodiment, each key structure 20 or 30 of the keyboard device of this embodiment further comprises a conductive element (not shown). The conductive element is disposed on under the keycap 201 or 301 (see FIGS. 4 and 7) and movable relative to the keycap 201 or 301. The conductive element is made of conductive material. An example of the conductive material includes but is not limited to conductive foam, metallic material, graphite or metallic paint.

The operations of the membrane circuit board 42 will be described as follows. When the keycap 201 or 301 of any key structure 20 or 30 is depressed and moved downwardly relative to the membrane circuit board 42, the corresponding conductive element is moved downwardly with the keycap 201 or 301 to approach the membrane circuit board 42. Meanwhile, the electric field between the corresponding first electrode pattern 421 and the corresponding second electrode pattern 422 is subjected to a change. Since the corresponding membrane switch 423 is triggered, the membrane circuit board 42 generates the corresponding key signal.

In this embodiment, each first electrode pattern 421 and the corresponding second electrode pattern 422 are discretely arranged on the same horizontal plane. It is noted that numerous modifications and alterations may be made while retaining the teachings of the invention. For example, in some other embodiments, each first electrode pattern 421 and the corresponding second electrode pattern 422 may be discretely arranged on different horizontal planes. That is, each first electrode pattern 421 may be disposed over or under the corresponding second electrode pattern 422. In some embodiments, a spacer layer (e.g., a UV adhesive layer) is coated or printed on each first electrode pattern 421 and the corresponding second electrode pattern 422. Consequently, each first electrode pattern 421 and the corresponding second electrode pattern 422 are separated from each other vertically.

The way of generating the key signal in the capacitive sensing manner and the operating principle thereof are well known to those skilled in the art, and are not redundantly described herein. The first electrode pattern 421 and the second electrode pattern 422 as shown in FIG. 8 are examples of the sensing circuit patterns. It is noted that numerous modifications and alterations of the sensing circuit pattern may be made while retaining the teachings of the invention.

In the first, second and third embodiments, the illumination module is a front light source between the membrane circuit board 22 and the electronic paper display element 23 in order to provide the light beam to the electronic paper display element 23. It is noted that the type of the illumination module and the way of illuminating the electronic paper display element are not restricted.

Figure 9:
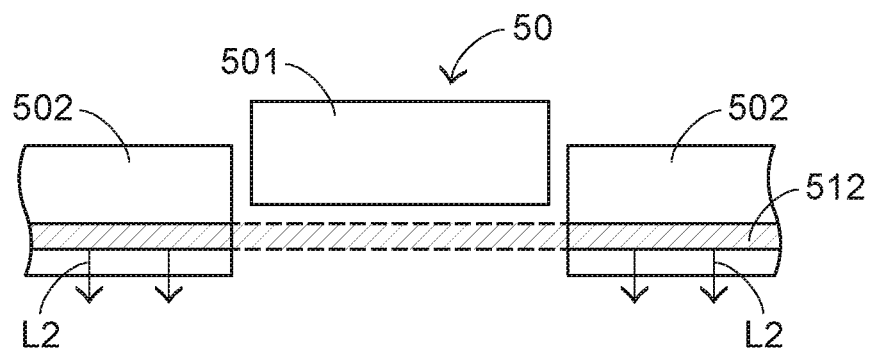
FIG. 9 is a schematic cross-sectional view illustrating a key structure and an illumination module of a keyboard device according to a fourth embodiment of the present invention.
Figure 10:
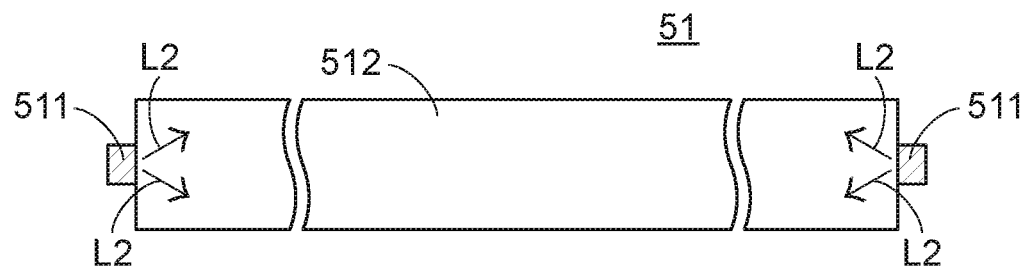
FIG. 10 is a schematic cross-sectional view illustrating a portion of the illumination module of FIG. 9.

Please refer to FIGS. 9 and 10. FIG. 9 is a schematic cross-sectional view illustrating a key structure and an illumination module of a keyboard device according to a fourth embodiment of the present invention. FIG. 10 is a schematic cross-sectional view illustrating a portion of the illumination module of FIG. 9. The components of this embodiment similar to those of the first, second and third embodiment are not redundantly described herein. In comparison with the first, second and third embodiments, the type and location of the illumination module 51 are distinguished. Moreover, the type and location of the illumination module 51 of this embodiment may be applied to the keyboard device of the first embodiment, the second embodiment, the third embodiment or the following embodiments.

In an embodiment, the keyboard device comprises plural illumination modules 51. Each illumination module 51 is a fiber-optic light source. The illumination module 51 comprises at least one light-emitting element 511 (e.g., a light emitting diode) and an optical fiber 512. The light-emitting element 511 emits a second light beam L2. The optical fiber 512 is used for guiding the second light beam L2. Each key structure 50 further comprises a frame module 502. The keycap 501 is movable within the frame module 502. These illumination modules 51 are buried within the frame module 502. The frame module 502 is made of transparent material, or the frame module 502 has light-transmissible regions (not shown) for the second light beam L2 to pass through. The second light beam L2 from the illumination module 51 is projected downwardly to the electronic paper display element 23 (see FIGS. 4 and 6). Consequently, the plural key symbols (see FIG. 6) on the electronic paper display element 23 are illuminated by the second light beam L2. Preferably but not exclusively, the optical fiber 512 further comprises plural microstructures (not shown). While the second light beam L2 is transferred through the optical fiber 512, the second light beam L2 is reflected or scattered by the microstructures. Due to the microstructures, the second light beam L2 is uniformly and downwardly projected to the electronic paper display element 23. Consequently, the plural key symbols on the electronic paper display element 23 are uniformly illuminated.

Figure 11:
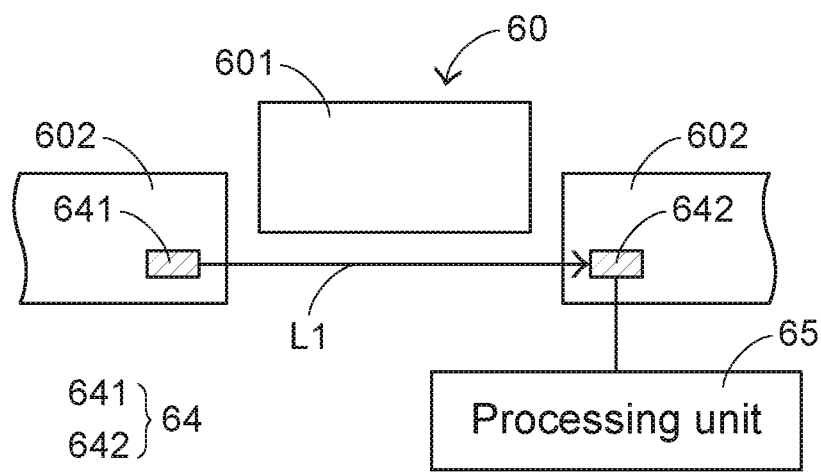
FIG. 11 is a schematic cross-sectional view illustrating a key structure and an optical switch module of a keyboard device according to a fifth embodiment of the present invention.
Figure 12:
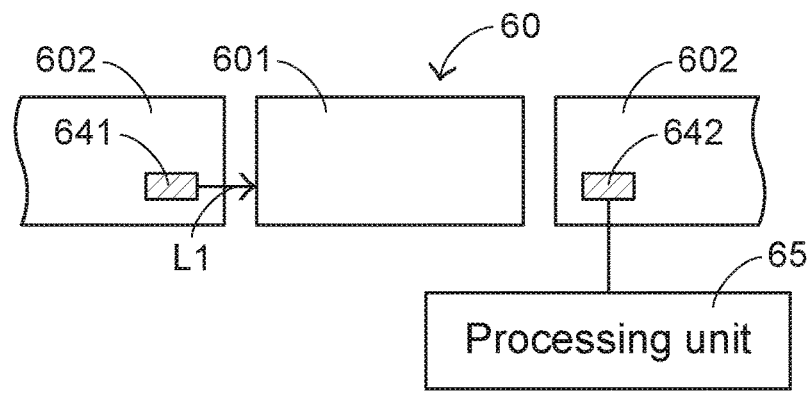
FIG. 12 is a schematic cross-sectional view illustrating the key structure and the optical switch module of FIG. 11, in which the keycap is depressed.

In the first, second, third and fourth embodiment, the membrane switch of the membrane circuit board is triggered to generate the key signal. It is noted that the way of generating the key signal is not restricted. Please refer to FIGS. 11 and 12. FIG. 11 is a schematic cross-sectional view illustrating a key structure and an optical switch module of a keyboard device according to a fifth embodiment of the present invention. FIG. 12 is a schematic cross-sectional view illustrating the key structure and the optical switch module of FIG. 11, in which the keycap is depressed. The components of this embodiment similar to those of the first, second, third and fourth embodiments are not redundantly described herein. In comparison with the first, second, third and fourth embodiments, the membrane switch 224 of the membrane circuit board 22 or the membrane switch 423 of the membrane circuit board 42 is replaced by an optical switch module 64 and a processing unit 65. Moreover, the optical switch module 64 and the processing unit 65 of this embodiment may be applied to the keyboard device of the first embodiment, the second embodiment, the third embodiment or the following embodiments.

In an embodiment, the keyboard device comprises plural optical switch modules 64 corresponding to the plural key structures 60. Each optical switch module 64 comprises an optical emitter 641 and an optical sensor 642. The optical emitter 641 emits a light beam (e.g., a first light beam L1). The optical sensor 642 is used for receiving the first light beam L1. The keyboard device further comprises a processing unit 65. The processing unit 65 is electrically connected with the optical sensor 642. According to the sensing result of the optical sensor 642, the processing unit 65 generates the corresponding key signal. The sensing result of the optical sensor 642 is different according to the location of the keycap 601.

Moreover, each key structure 60 further comprises a frame module 602. The keycap 601 is movable within the frame module 602. The optical switch module 64 is disposed within the frame module 602. The optical emitter 641 and the optical sensor 642 of the optical switch module 64 are on two opposite sides of the keycap 601. When the keycap 601 is not depressed, the keycap 601 is not in the optical path of the first light beam L1. As shown in FIG. 11, the first light beam L1 from the optical emitter 641 is directly projected to the optical sensor 642. While the keycap 601 is depressed and moved downwardly, the keycap 601 is in the optical path of the first light beam L1 to obstruct the first light beam L1. As shown in FIG. 12, the first light beam L1 from the optical emitter 641 cannot be received by the optical sensor 642. Since the sensing result indicates that the first light beam L1 cannot be received by the optical sensor 642, the processing unit 65 generates the corresponding key signal.

It is noted that the example of the optical switch module is not restricted. That is, numerous modifications and alterations may be made while retaining the teachings of the invention. In another embodiment, the keycap is in the optical path of the first light beam to obstruct the first light beam when the keycap is not depressed. Meanwhile, the first light beam from the optical emitter cannot be received by the optical sensor. While the keycap is depressed and moved downwardly, the keycap is not in the optical path of the first light beam. Consequently, the first light beam from the optical emitter is directly projected to the optical sensor 642. Since the sensing result indicates that the first light beam is directly received by the optical sensor, the processing unit generates the corresponding key signal.

Figure 13:
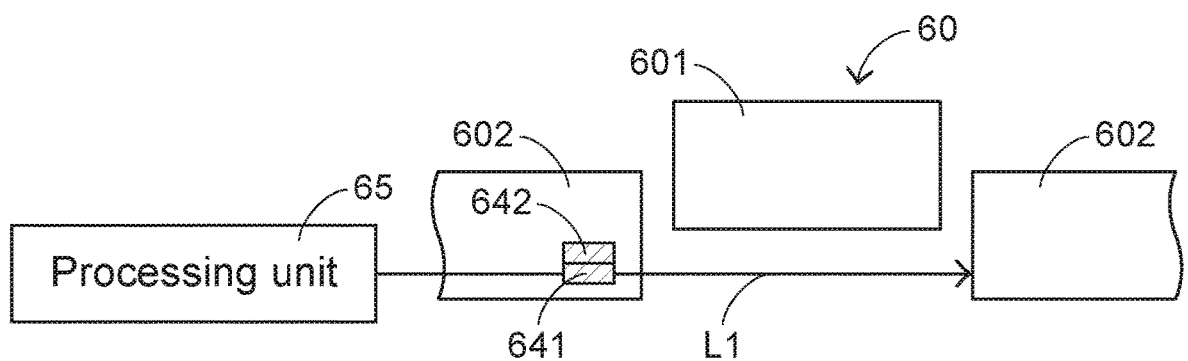
FIG. 13 is a schematic cross-sectional view illustrating a key structure and an optical switch module of a keyboard device according to a sixth embodiment of the present invention.
Figure 14:
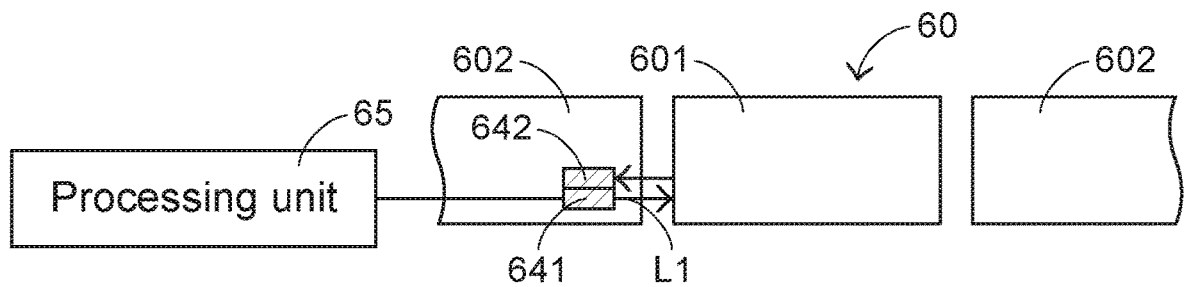
FIG. 14 is a schematic cross-sectional view illustrating the key structure and the optical switch module of FIG. 13, in which the keycap is depressed.

FIG. 13 is a schematic cross-sectional view illustrating a key structure and an optical switch module of a keyboard device according to a sixth embodiment of the present invention. FIG. 14 is a schematic cross-sectional view illustrating the key structure and the optical switch module of FIG. 13, in which the keycap is depressed. This embodiment is a variant example of the fifth embodiment. In this embodiment, the optical emitter 641 and the optical sensor 642 are on the same side of the keycap 601. When the keycap 601 is not depressed, the keycap 601 is not in the optical path of the first light beam L1. As shown in FIG. 13, the first light beam L1 from the optical emitter 641 cannot be received by the optical sensor 642. While the keycap 601 is depressed and moved downwardly, the keycap 601 is in the optical path of the first light beam L1. As shown in FIG. 14, the first light beam L1 from the optical emitter 641 is reflected by the keycap 601 and projected to the optical sensor 642. Since the sensing result indicates that the first light beam is received by the optical sensor, the processing unit generates the corresponding key signal.

From the above descriptions, the present invention provides the keyboard device. The keyboard device is equipped with the electronic paper display element for dynamically displaying the key symbols. Consequently, the key symbols to be recognized by the user can be dynamically changed according to the applications such the country and the user's habit. When compared with the time-consuming process of printing the key symbols on the keycaps of the conventional keyboard device, the keyboard device of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. A keyboard device, comprising:
plural key structures comprising plural keycaps, respectively;
an electronic paper display element, wherein plural key symbols are displayed on the electronic paper display element;
a membrane circuit board arranged between the plural keycaps and the electronic paper display element, and comprising plural membrane switches corresponding to the plural key structures, wherein when one of the plural keycaps is moved downwardly toward the membrane circuit board to trigger the corresponding membrane switch, the membrane circuit board generates a corresponding key signal; and
an illumination module emitting a light beam to the electronic paper display element so as to illuminate the plural key symbols, wherein the illumination module is a fiber-optic light source, and each of the plural key structures further comprises a frame module, wherein the fiber-optic light source is buried within the frame module.

2. The keyboard device according to claim 1, wherein the illumination module is a front light source, and the front light source is arranged between the electronic paper display element and the membrane circuit board.

3. The keyboard device according to claim 2, wherein the light beam provided by the front light source is a monochromatic light beam or a polychromatic light beam.

4. The keyboard device according to claim 1, wherein when the keycap is not depressed, the keycap is returned to an original position in response to a magnetic force or an elastic force.

5. The keyboard device according to claim 4, wherein each of the plural key structures further comprises:
 a frame module, wherein the corresponding keycap is movable within the frame module;
 a first magnetic element disposed on the corresponding keycap; and
 a second magnetic element disposed on the frame module, wherein the magnetic force is generated by the first magnetic element and the second magnetic element.

6. The keyboard device according to claim 5, wherein the frame module comprises a key frame and a connecting element, wherein the connecting element is disposed under the key frame, the keycap is movable upwardly or downwardly relative to the key frame through the connecting element, and the second magnetic element is disposed on the connecting element.

7. The keyboard device according to claim 4, wherein each of the plural key structures further comprises an elastic element, and the elastic element is arranged between the keycap and the membrane circuit board, wherein while the keycap is depressed, the elastic element is compressed to generate the elastic force, wherein when the keycap is not depressed, the keycap is returned to an original position in response to the elastic force.

8. The keyboard device according to claim 1, wherein the membrane circuit board comprises an upper film layer and a lower film layer, wherein a first circuit pattern is formed on the upper film layer, a second circuit pattern is formed on the lower film layer, the first circuit pattern comprises plural upper contacts corresponding to the plural key structures, and the second circuit pattern comprises plural lower contacts corresponding to the plural upper contacts, wherein each of the upper contacts and the corresponding lower contact are separated from each by a spacing distance and collectively defined as the corresponding membrane switch.

9. The keyboard device according to claim 1, wherein the membrane circuit board comprises plural first electrode patterns corresponding to the plural key structures and plural second electrode patterns corresponding to the plural first electrode patterns, and each of the first electrode patterns and the corresponding second electrode pattern are separated from each by a spacing distance and collectively defined as the corresponding membrane switch, wherein when the membrane circuit board is electrically conducted, plural electric fields are generated between the plural first electrode patterns and the corresponding second electrode patterns, wherein when one of the plural keycaps is depressed to approach the membrane circuit board, the corresponding electric field is subjected to a change, so that the membrane circuit board generates the corresponding key signal.

* * * * *